United States Patent
Watanabe et al.

(10) Patent No.: US 7,358,714 B2
(45) Date of Patent: Apr. 15, 2008

(54) TESTING METHOD AND TESTING APPARATUS

(75) Inventors: Takao Watanabe, Kawasaki (JP); Shigenobu Ishihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 262 days.

(21) Appl. No.: 11/334,399

(22) Filed: Jan. 19, 2006

(65) Prior Publication Data

US 2007/0091698 A1    Apr. 26, 2007

(30) Foreign Application Priority Data

Oct. 13, 2005   (JP)   ............... 2005-299200

(51) Int. Cl.
  *G01R 31/28*   (2006.01)
(52) U.S. Cl. .................... 324/73.1; 324/765
(58) Field of Classification Search ............ None
  See application file for complete search history.

(56) References Cited

U.S. PATENT DOCUMENTS 6,023,778 A * 2/2000 Li ..................... 714/726
6,028,440 A * 2/2000 Roethig et al. .......... 324/765
7,162,652 B2 * 1/2007 Issa et al. ............... 713/300
2005/0201457 A1 * 9/2005 Allred et al. ........... 375/232

FOREIGN PATENT DOCUMENTS

JP      2001-124835 A       5/2001
JP      2001284531 A   *  10/2001

* cited by examiner

*Primary Examiner*—Ha Tran Nguyen
*Assistant Examiner*—Richard Isla-Rodas
(74) *Attorney, Agent, or Firm*—Arent Fox LLP

(57) ABSTRACT

A testing method of a semiconductor integrated circuit device includes a testing step of conducting a functional test by supplying test pattern data to a semiconductor integrated circuit device mounted upon a testing apparatus, and a post processing step conducted after the testing step for continuously driving the semiconductor integrated circuit device by supplying dummy test pattern to the semiconductor integrated circuit device, wherein the test pattern data is supplied with a first system clock speed while the dummy test pattern data is supplied with a second, slower system clock speed, the post processing step switching a system clock speed of the testing apparatus from the first system clock speed to the second system clock speed at the same time as finishing of the testing step.

12 Claims, 11 Drawing Sheets

TESTING METHOD AND TESTING APPARATUS

CROSS-REFERENCE TO RELATED APPLICATION

The present application is based on Japanese priority application No.2005-299200 filed on Oct. 13, 2005, the entire contents of which are hereby incorporated by reference.

BACKGROUND OF THE INVENTION

The present invention generally relates to semiconductor devices and more particularly to a testing method and testing apparatus of semiconductor integrated circuit devices.

A semiconductor integrated circuit device generally includes therein a large number of semiconductor devices each constituting a gate. Thus, manufacturers of semiconductor integrated circuit devices are required to conduct a thorough test before shipment of the semiconductor integrated circuit devices as a product.

While the test of such semiconductor integrated circuit devices includes testing of electrical properties of the individual element devices, functional test is becoming more important recently particularly in relation to high-performance semiconductor integrated circuit devices performing versatile functions.

In the functional test of semiconductor integrated circuit devices, a wafer or chip formed with semiconductor integrated circuit device to be tested is mounted upon a test bed of a testing apparatus called an LSI tester, and a test vector is produced and supplied to the semiconductor integrated circuit device, wherein the test vector is a combination of input signal pulses formed by pattern generators in correspondence to various operational states of the semiconductor integrated circuit device.

Thus, the testing apparatus is provided with a power supply unit that drives the semiconductor integrated circuit device to be tested, and the semiconductor integrated circuit device under testing performs operations corresponding to the test vectors. Thereby, the operation of the semiconductor integrated circuit device is measured by a measuring device connected to an output pin.

FIG. 1 schematically shows the construction of a conventional testing apparatus 10 used commonly for testing semiconductor integrated circuit devices.

Referring to FIG. 1, the testing apparatus 10 includes a test bed 11 formed of a probe card, wherein the test bed 11 is mounted with a semiconductor integrated circuit device 11A to be tested. Further, the testing apparatus 10 includes a power supply unit 12 supplying a driving current to the semiconductor integrated circuit device 11A mounted upon the test bed 11, and a measurement unit 13 is provided for measuring the electrical properties of the semiconductor integrated circuit device 11A thus mounted upon the test bed 11.

In the illustrated example, the measuring unit 13 includes an UDC (universal DC) unit 13A and an MDC (multiple DC) unit 13B used for measuring the dc characteristics.

Further, the testing apparatus 10 is provided with pattern generators such as an ALPG (algorithmic pattern generator) 14A having the function of internal operation and producing the test bit patterns, an SCPG (scan pattern generator) 14B generating and storing scan patterns necessary for realizing LSSD (level-sensitive scan design), and the like, wherein the pin data constituting the test vector is formed from the test bit patterns thus produced by various pattern generators by a pin data selector 15A, which is provided also as a part of the testing apparatus 10.

The pulses constituting the pin data thus formed are then supplied to the semiconductor integrated circuit device 11A on the test bed 11 via a wave formatter 11A, wherein the wave formatter 11A is provided as a part of the testing apparatus.

Further, the testing apparatus 10 is provided with a rate generator 15B that determines the test period by generating a system clock and controls the foregoing wave formatter 15A via a timing generator 16B by way of the system clock thus generated.

Further, the testing apparatus 10 is provided with an SQPG (sequential pattern generator) 16C that stores the test pattern in a buffer memory and produces the test pattern by outputting the content of the buffer memory at high speed. Thereby, the SQPG 16C controls the timing generator 16B via the timing memory 16C and further the wave formatter 16A via a wave memory.

Further, the testing apparatus 10 is provided with a TTB (truth table buffer) 16D, which is a field for storing the test pattern in the pattern generator, wherein the TTB 16D controls the timing generator 16B via the timing memory 16C and the wave formatter 16A via the wave memory.

Further, the response of the semiconductor integrated circuit device 11A to the foregoing test vector is sent to a digital comparator 16E for comparison, and the result of the comparison is stored in a data fail memory 15E and an AFM (address fail memory) 15F.

Further, the testing apparatus 10 includes a processor 10A that controls the operation of various parts of the testing apparatus 10.

REFERENCE

PATENT REFERENCE Japanese Laid-Open Patent Application 2001-124835

SUMMARY OF THE INVENTION

Meanwhile, with the semiconductor integrated circuit device that performs complex functions at high speed by using recent ultra-miniaturized semiconductor devices, the supply voltage is lowered with decrease of the gate length, and thus, there is a need that the power supply 12 supplies a low voltage to the semiconductor integrated circuit device to be tested as the drive voltage.

Further, with increased diversity in the function of the semiconductor integrated circuit, there is a corresponding increase in the depth of the test vector (increase in the number of combinations of the test data bits). Thereby, there frequently occurs the situation in which a very large number of transistors are turned on with the same timing.

When this happens at the time of the test, the supply capacity of the power supply 12 is depleted and there can occur the situation shown in FIG. 2 in which the supply voltage Vdd drops by 1V or more with start of the test. In the example of FIG. 2, it should be noted that the nominal supply voltage is 1.8V and that FIG. 2 shows the voltage change caused in two power supply systems Vdd1 and Vdd2 provided in the same semiconductor integrated circuit device. In FIG. 2, one division in the vertical axis represents 1V while one division in the horizontal axis represents 200 μ seconds.

Now, when there is caused such a large voltage drop in the supply voltage, the power supply unit operates to increase the supply of the current so as to compensator for the voltage drop, while the response speed (through rate) of power supply unit is in the order of 10 μs/1 mV, which is much slower than the response speed of the semiconductor integrated circuit device, which is in the order of nanoseconds. Thus, the nominal supply voltage is recovered slowly while the test is in progress.

On the other hand, when the test is over with such a testing apparatus, all the gates are turned off at the moment the test is over and the supply capacity of the power supply unit 12 turns to become excessive instantaneously. Thereby, there occurs an overshoot in the supply voltage at the same time the test is over, resulting in a voltage surge of 1.5-2V as represented in FIG. 2.

While this overshooting of the supply voltage is gradually resolved with the operation of the power supply unit 12, the voltage surge is nevertheless applied to the semiconductor devices in the semiconductor integrated circuit device under testing. Thereby, there arises a problem in that the semiconductor devices, which have been normal during the functional test, turns to be defective with the completion of the test. The defects thus caused are detected for the first time when the user has used the semiconductor integrated circuit device.

In the ultra-miniaturized semiconductor devices operating with the normal voltage of 1.8V or less, voltage overshooting of 1.5-2V is not tolerable.

While such voltage overshooting itself can be avoided by decreasing the clock speed at the time of the functional test, such decrease of the clock speed increases the time needed for the test. Further, such a test does not comply with the predetermined specification of the semiconductor integrated circuit device.

In a first aspect, the present invention provides a testing method of a semiconductor integrated circuit device, comprising:

a testing step of conducting a functional test by supplying test pattern data to a semiconductor integrated circuit device mounted upon a testing apparatus; and a post processing step conducted after said testing step for continuously driving said semiconductor integrated circuit device after said testing step by supplying dummy test pattern to said semiconductor integrated circuit device, wherein said test pattern data is supplied with a first system clock speed while said dummy test pattern data is supplied with a second, slower system clock speed, said post processing step switching a system clock speed of said testing apparatus from said first system clock speed to said second system clock speed at the same time as finishing of said testing step.

In another aspect, the present invention provides a testing apparatus of semiconductor integrated circuit device, comprising:

a test bed mounted with a semiconductor device to be tested;

a power supply unit supplying a drive current to said semiconductor integrated circuit device mounted upon said test bed;

a pattern generator supplying test pattern data to said semiconductor integrated circuit device mounted upon said test bed; and a verification circuit verifying a response of said semiconductor integrated circuit device caused in response to supply of said test pattern data, wherein said testing apparatus further comprises a controller for controlling a system clock speed thereof, said pattern generator supplying said test pattern data to said semiconductor integrated circuit device at the time of functional test of said semiconductor integrated circuit device, with a first system clock speed, said pattern generator supplying dummy test pattern to said semiconductor integrated circuit device at the time of post processing conducted after said functional test with a second, slower system clock speed, said controller changing a system clock speed of said testing apparatus from said first system clock speed to said second system clock speed at the same time to completion of said functional test.

According to the present invention, driving of the semiconductor integrated circuit device is not shut down immediately when the functional test is over but the semiconductor integrated circuit device is continued driven by the dummy test pattern with lowered system clock speed. With this, sudden change of load in the power supply system is avoided, and the problem of damaging of the semiconductor devices in the tested semiconductor integrated circuit device by the overshooting of the supply voltage is suppressed.

With such post processing conducted after the testing, it is preferable to decrease the system clock speed gradually. Particularly, it is preferable to determine the optimum system clock speed by monitoring the variation in the supply voltage.

According to the needs, it is possible to connect a capacitance element absorbing the voltage overshoot to the power supply circuit in parallel. Further, according to the needs, it is possible to connect charged capacitance element parallel to the power supply circuit for compensating the voltage drop at the time of the functional test.

Other objects and further features of the present invention will become apparent from the following detailed description when read in conjunction with the attached drawings.

DETAILED DESCRIPTION OF THE INVENTION

First Embodiment

Figure 3:
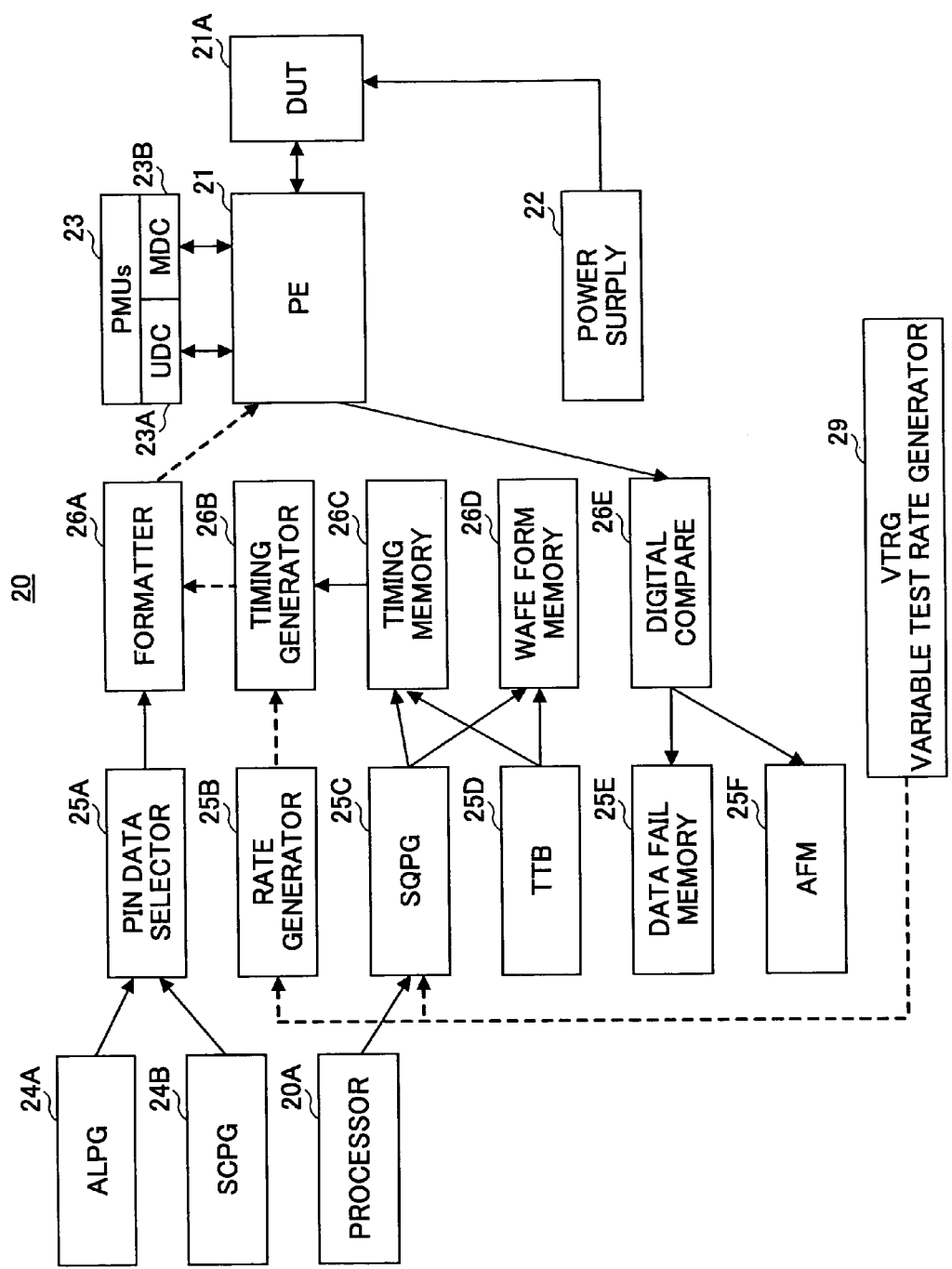
FIG. 3 is a diagram showing the schematic construction of a testing apparatus according to a first embodiment of the present invention.

FIG. 3 is a diagram showing the schematic construction of a testing apparatus 20 of a semiconductor integrated circuit device according to a first embodiment of the present invention.

Referring to FIG. 3, the testing apparatus 20 includes a test bed 21 formed of a probe card, wherein the test bed 21 is mounted with a semiconductor integrated circuit device 21A to be tested. Further, the testing apparatus 20 includes a power supply unit 22 supplying a driving current to the semiconductor integrated circuit device 21A mounted upon the test bed 21, and a measurement unit 23 is provided for measuring the electrical properties of the semiconductor integrated circuit device 21A thus mounted upon the test bed 21.

In the illustrated example, the measuring unit 23 includes an UDC (universal DC) unit 23A and an MDC (multiple DC) unit 23B used for measuring the dc characteristics.

Further, the testing apparatus 20 is provided with pattern generators such as an ALPG (algorithmic pattern generator) 24A having the function of internal operation and producing the test bit patterns, an SCPG (scan pattern generator) 24B generating and storing scan patterns necessary for realizing LSSD (level-sensitive scan design), and the like, wherein, the pin data constituting the test vector is formed from such test bit patterns thus produced by the various pattern generators by a pin data selector 25A, which is provided also as a part of the testing apparatus 20.

The pulses constituting the pin data thus formed are thus supplied to the semiconductor integrated circuit device 21A on the test bed 21 via a wave formatter 21A, wherein the wave formatter 21A is provided as a part of the testing apparatus.

Further, the testing apparatus 20 is provided with a rate generator 25B that determines the test period by generating a system clock and controlling the foregoing wave formatter 25A via a timing generator 26B by the system clock thus generated.

Further, the testing apparatus 20 is provided with an SQPG (sequential pattern generator) 26C that stores the test pattern in a buffer memory and produces the test pattern by outputting the content of the buffer memory at high speed. Thereby, the SQPG 26C controls the timing generator 26B via the timing memory 26C and further the wave formatter 26A via a wave memory.

Further, the testing apparatus 20 is provided with a TTB (truth table buffer) 26D, which is a field for storing the test pattern in the pattern generator, wherein the TTB 26D controls the timing generator 26B via the timing memory 26C and the wave formatter 26A via the wave memory.

Further, the response of the semiconductor integrated circuit device 21A to the foregoing test vector is sent to a digital comparator 26E for comparison, and the result of the comparison is stored in a data fail memory 25E and an AFM (address fail memory) 25F.

Further, the testing apparatus 20 includes a processor 20A that controls the operation of various parts of the testing apparatus 20.

Further, the testing apparatus 20 is provided with a VTRG (variable test rate generator) 29 that changes the system clock speed by controlling the rate generator 25B, wherein the VTRG 29 switches the system clock speed to a lower rate at the same time the functional test of the semiconductor integrated circuit device 21A is over, and executes the test terminating procedure.

Figure 4:
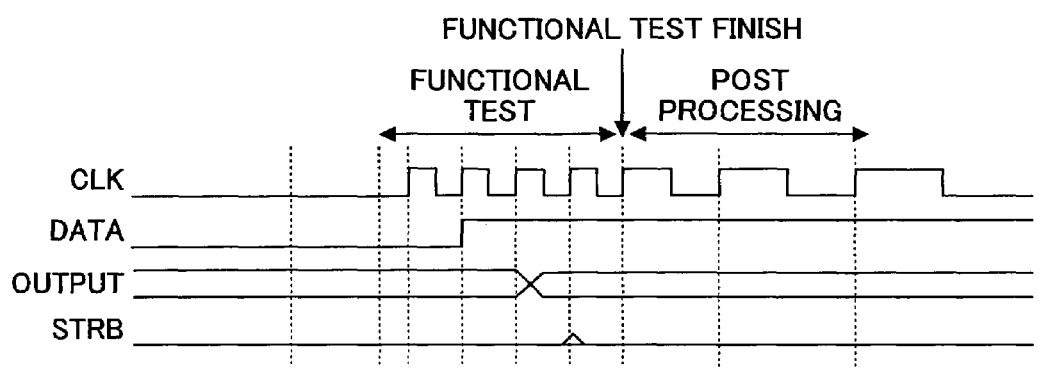
FIG. 4 is a diagram showing the operation of the testing apparatus of FIG. 3.

FIG. 4 shows such a change of the system clock CLK before and after the functional test.

Referring to FIG. 4, supply of high speed system clock CLK is commenced to the semiconductor integrated circuit device with start of the functional test, and test pattern data (DATA) is supplied further with a predetermined timing.

With such a functional test, it can be seen that there is caused a transition in the output state of the semiconductor integrated circuit device 21A after a predetermined time elapsed from commencing the supply of the test pattern data DATA.

With the example of FIG. 4, it can be seen further that a strobe signal STRB is supplied with a predetermined timing in the functional test.

Now, when the functional test is over, the present invention does not interrupt the supply of the test pattern data DATA and supply of the test pattern data to the semiconductor integrated circuit device 21A is continued in the form of supply of the dummy pattern data. Further, the clock speed is changed with the completion of the functional test with the present invention, and the period of the clock is increased gradually. Thereby, the rate of the clock is decreased gradually.

Figure 5:
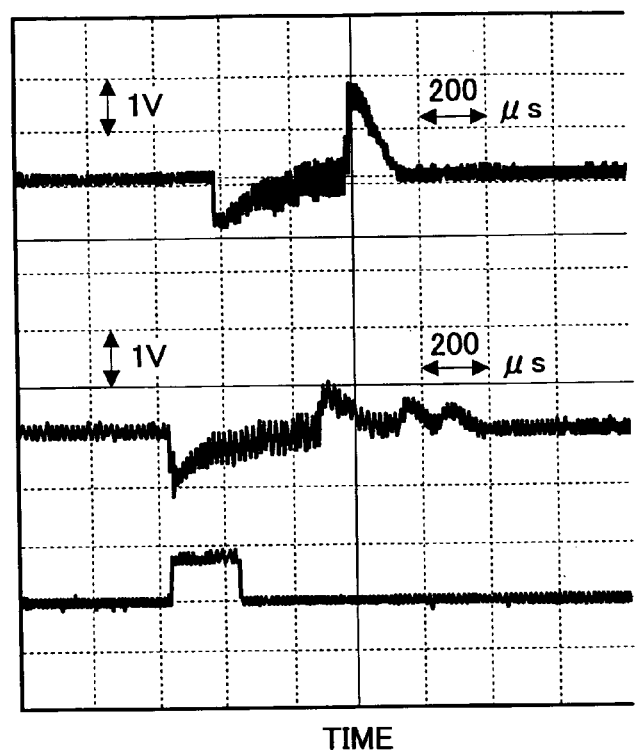
FIGS. 5A-5C are timing charts explaining the effect of the present invention.

Thus, the semiconductor devices in the semiconductor integrated circuit device continue operating, and there is no such a situation that all the gates are turned off at once. In the example of FIG. 5, it can be seen that the clock speed is decreased from 8.3 GHz at the time of the functional test with the proportion of 25-50% in each pulse. As a result, overshooting of the supply voltage occurring simultaneously with finishing of the functional test is effectively avoided.

Figure 1:
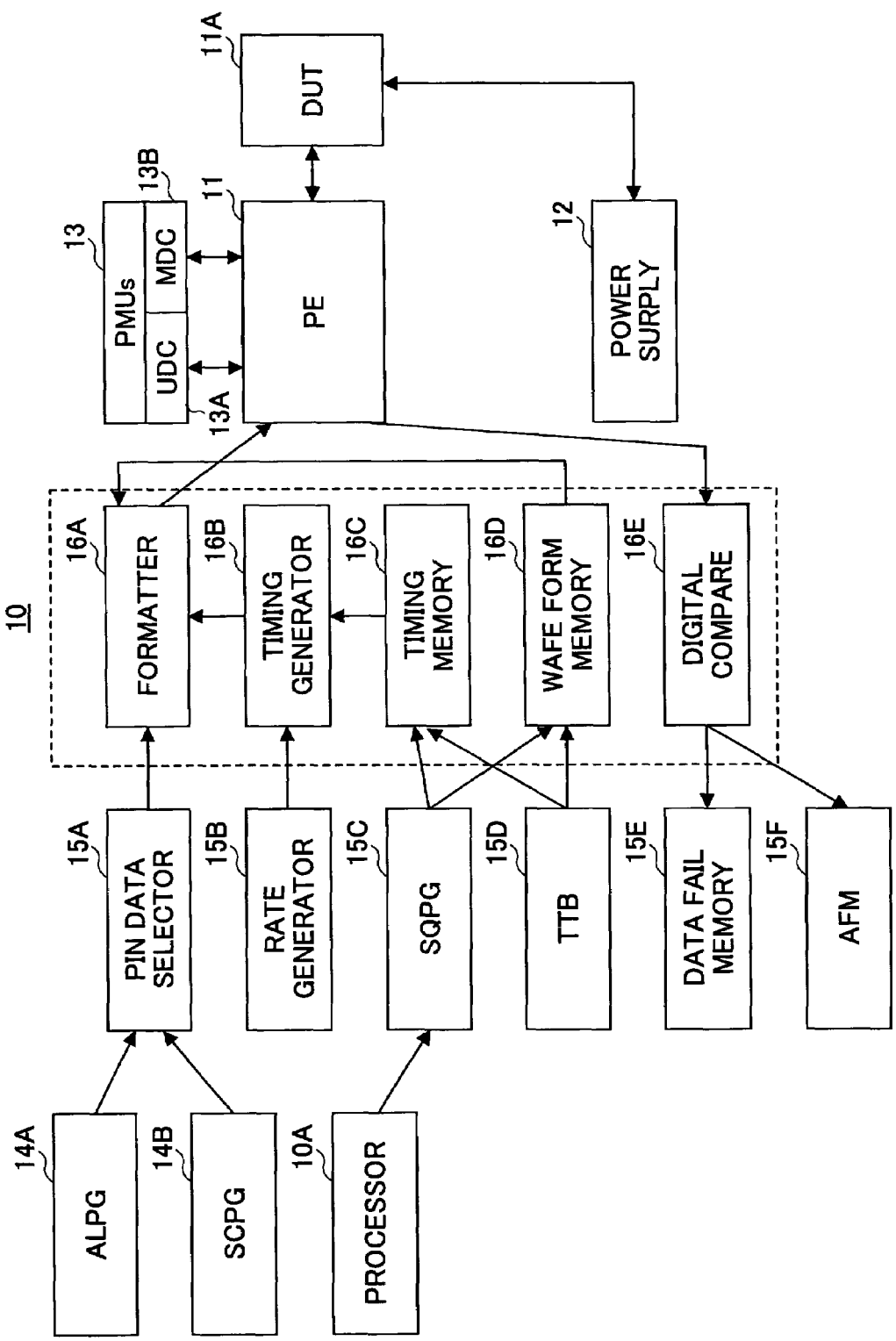
FIG. 1 is a diagram showing the schematic construction of a conventional testing apparatus.
Figure 2:
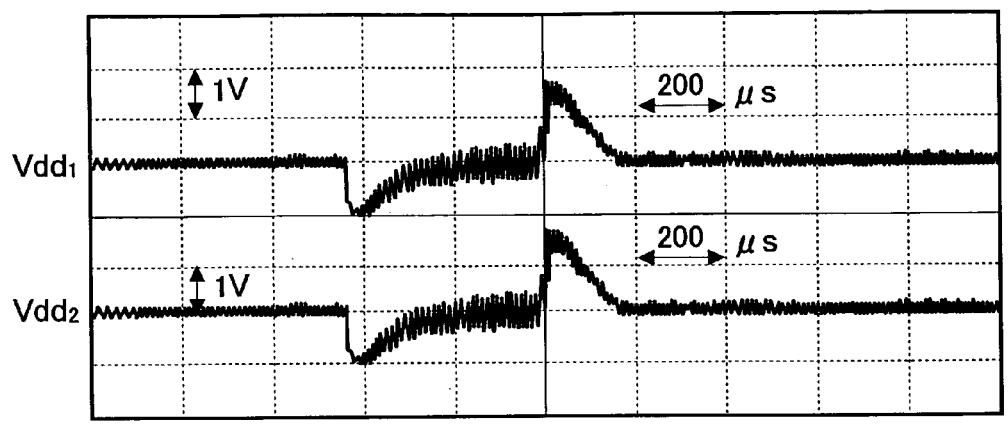
FIG. 2 is a diagram showing the problems of the conventional testing apparatus.

FIGS. 5A-5C are diagrams showing the variation of supply voltage Vdd before and after the functional test in comparison with the case of the functional testing apparatus 10 of FIG. 1, wherein FIG. 5A shows the case of using the functional testing apparatus 10 of FIG. 1, FIG. 5B shows the case of using the functional testing apparatus 20 of FIG. e5B, while FIG. 5C shows the test vector for the case of the functional test of FIG. 5B. In FIGS. 5A-5C, it should be noted that one division in the vertical axis represents 1V while one division in the horizontal axis represents 200µ seconds. It should be noted that the functional test has been conducted to the semiconductor devices of the nominal supply voltage of 1.8V.

Comparing FIG. 5A with FIG. 5B, it can be seen that the overshooting of the supply voltage at the time of finishing of the functional test is effectively suppressed by continuously driving the semiconductor integrated circuit device after the functional test by the dummy test data and gradually decreasing the system clock speed.

With the present embodiment, it should be noted that the VTRG 29 is driven in response to the finishing of the functional test and can be implemented by a numeric generator that provides a numeric value corresponding to the foregoing predetermined proportion to the rate generator 25B.

Thus, according to the present embodiment, damaging of the semiconductor integrated circuit device by the overshooting of the supply voltage at the time of finishing of the functional test is successfully avoided.

Second Embodiment

Figure 6:
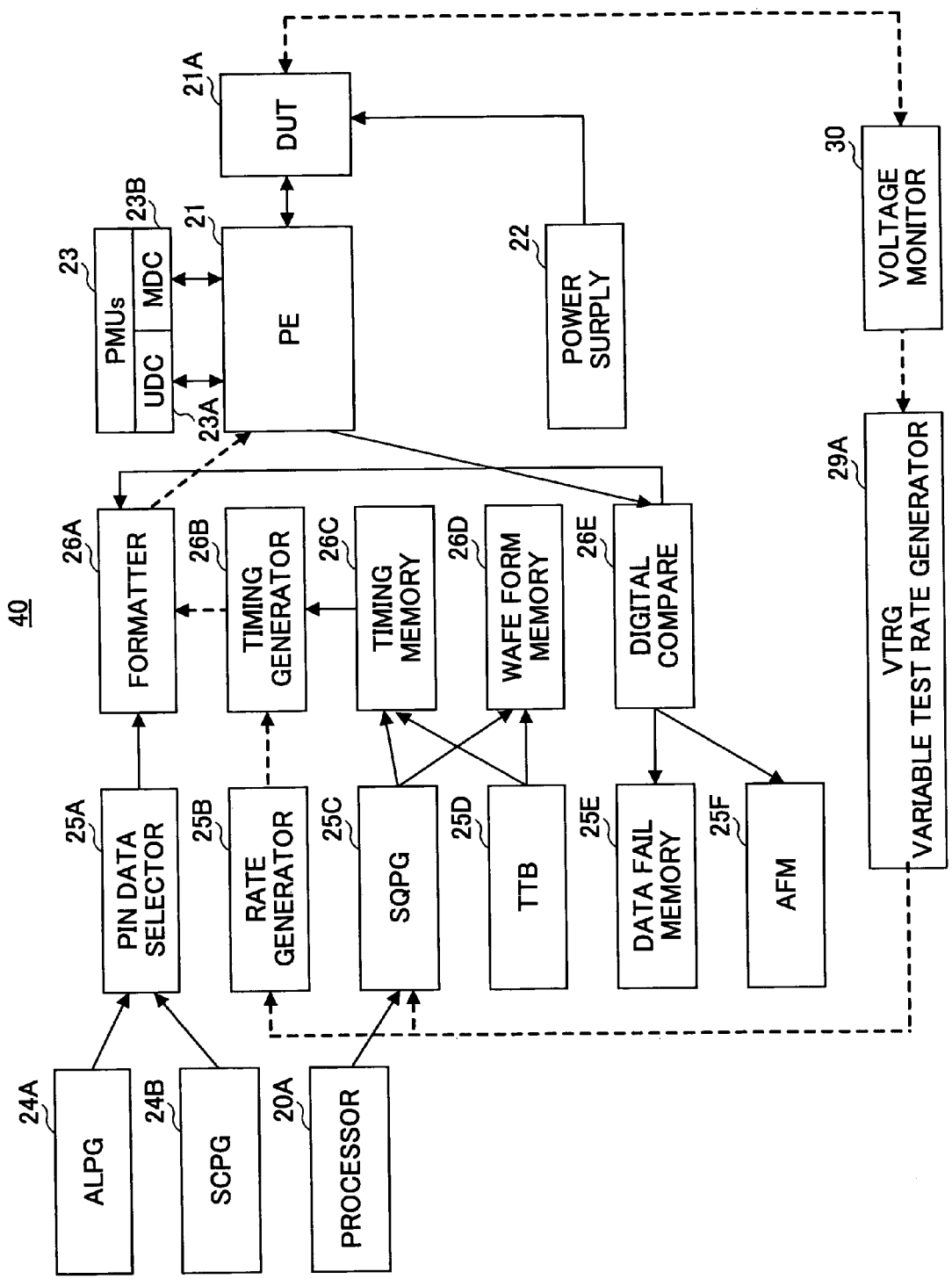
FIG. 6 is a diagram showing the schematic construction of a testing apparatus according to a second embodiment of the present invention.

FIG. 6 shows the construction of a testing apparatus 40 according to a second embodiment of the present invention, wherein those parts corresponding to the parts described previously are designated by the same reference numerals and the description thereof will be omitted.

Figure 7:
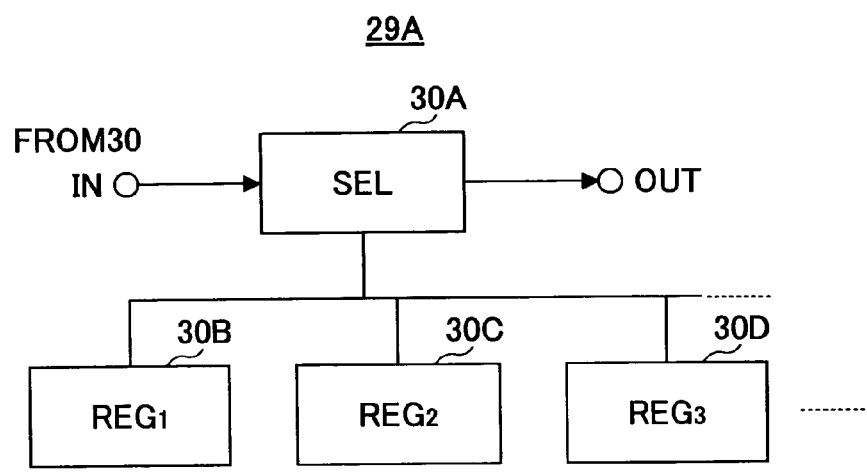
FIG. 7 is a block diagram showing a part of FIG. 6.

With the present embodiment, there is provided a peak voltage monitor 30 detecting the drop of the supply voltage at the time of the functional test, and a VTRG 29A is used in place of the VTRG 29 that has been used in the functional testing apparatus 20 for changing the clock speed with a constant rate, wherein the VTRG 29A is supplied with an output of the voltage monitor 30 as shown in FIG. 7 and determines the change rate of the system clock speed in response to the output of the voltage monitor 30.

In the case that the drop of the supply voltage at the time of the functional test is small, it is expected that the magnitude of voltage overshoot of the supply voltage after the functional test is also small. Thus, with the present embodiment, the change rate of the system clock in the post processing procedure after the functional test is determined based on the magnitude of the drop of the supply voltage at the time of the functional test. With such a construction, it becomes possible to finish the post processing procedure after the functional test with short time, without restricting the change rate of the system clock unnecessarily when the magnitude of overshoot of the supply voltage is small.

Referring to FIG. 7, the VTRG 30 is provided with a selection circuit 30A supplied with the output of the voltage monitor 30, wherein the selection circuit 30A is connected with a large number of registers 30B-30D each holding a constant corresponding to the change rate of the system clock speed.

Thus, the selection circuit 30A selects one of the registers in response to the output signal of the voltage monitor 30 and supplies the constant held therein to the foregoing rate generator 25B. Thereby, the selection circuit 30A is programmed so as to select a register holding a small constant when the voltage drop of the supply voltage is large and a register holding a large constant when the voltage drop of the supply voltage is small. For example, the relationship between the voltage drop and the selected constant can be set in a linear relationship. Alternatively, the foregoing relationship can be set in the form of quadric curve, parabolic curve, or the like.

Further, the construction of FIG. 7 can be realized by a digital circuit.

Figure 8:
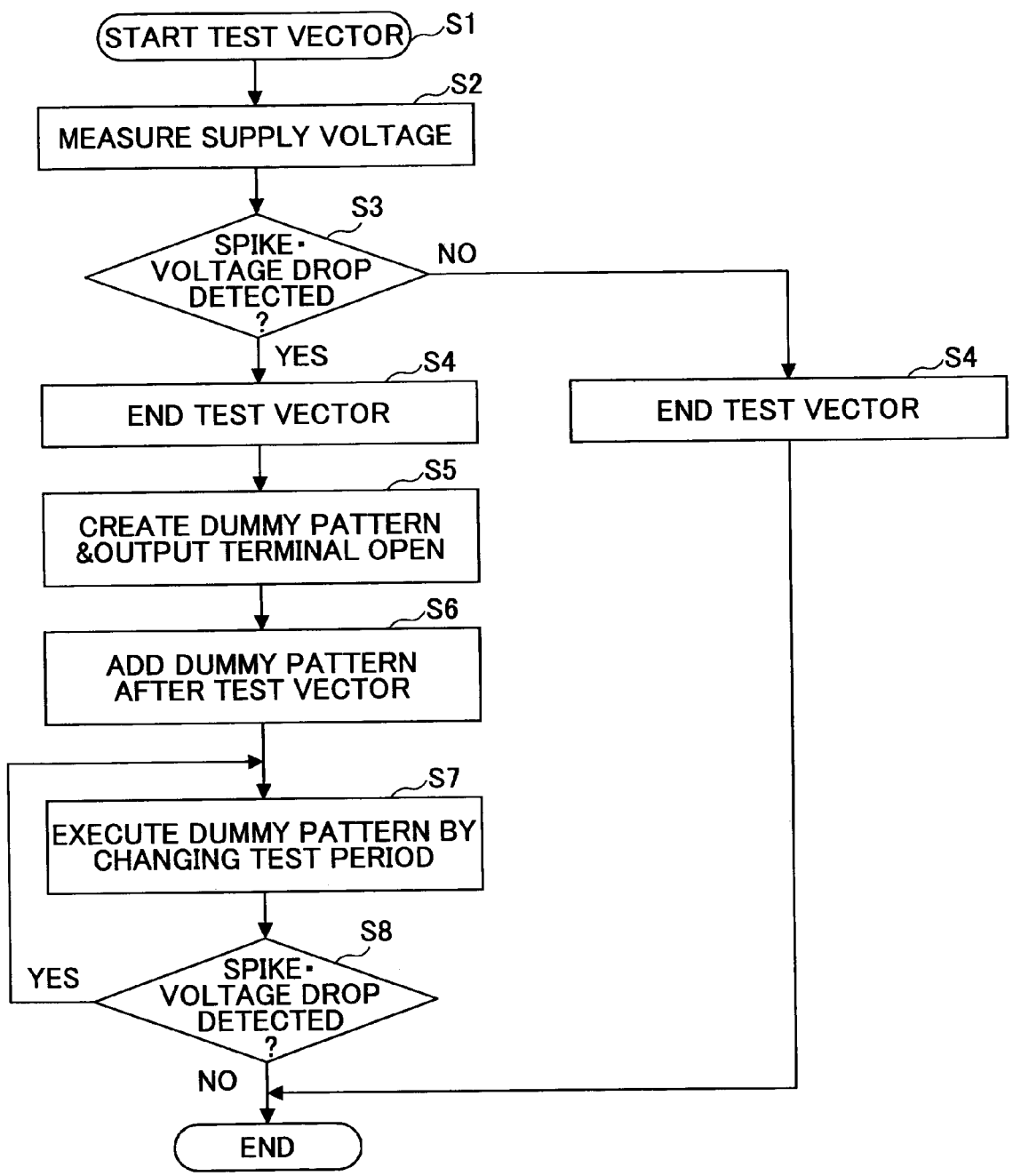
FIG. 8 is a flowchart explaining the operation of the testing apparatus of FIG. 6.

FIG. 8 is a flowchart showing the functional test and the subsequent terminating processing of the testing apparatus 40.

Referring to FIG. 8, the functional test is started with a step 1 and the supply voltage is measured in a step 2 by the voltage monitor 30.

Next, in a step 3, the VTRG 29A or the processor 20A detects the existence of voltage drop based on the output of the voltage monitor 30 and terminates the test immediately by withholding the supply of the test vector to the semiconductor integrated circuit device 21A in a step 4 when the magnitude of the voltage drop is within a predetermined range.

When there is detected a drop of supply voltage in the step 3, on the other hand, a step 5 is conducted to form the dummy test vector with termination of supplying the test vector in the step 4 and the dummy test vector is supplied to the semiconductor integrated circuit device 21A. For the dummy test vector, it is possible to use a suitable test pattern, while it is also possible to use the same test pattern used for the functional test. Further, in the step 5, the terminal used for connection to the semiconductor integrated circuit 21A is opened so that the response of the semiconductor integrated circuit device 21A to the dummy test vector is not supplied to the measuring unit 23, the date fail memory 25E, the AFM 25F, or the like.

Further, in a step 6, the dummy test vector is continuously applied to the semiconductor integrated circuit device e21A and the change rate of the system clock speed is reduced in correspondence to the voltage drop detected in the step 3.

With the present embodiment, overshooting of the supply voltage is monitored by the voltage monitor 30 further in a step 8, and the VTRG 29A decreases the change rate of the system clock speed when the magnitude of the overshot has exceeded a predetermined range.

By repeating the steps 7 and 8, the system clock speed is decreased gradually such that there is caused no overshooting in the supply voltage, and the damaging of the semiconductor integrated circuit device with the finishing of the functional test is successfully avoided.

In the present embodiment, it is also possible to execute the steps 7 and 8 by using a current monitor in place of the voltage monitor 30 so as to avoid undershooting of the supply current.

Third Embodiment

Figure 9:
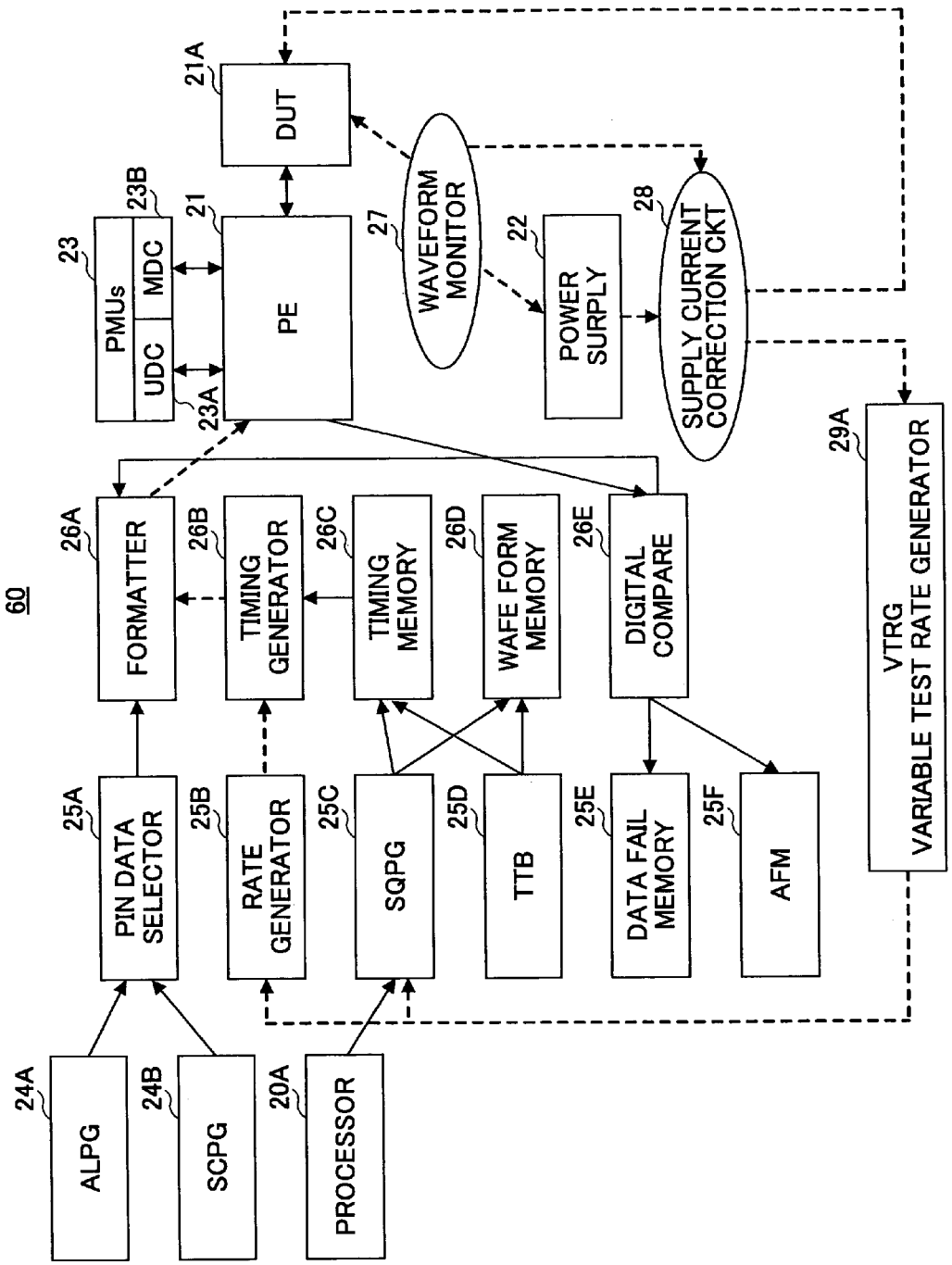
FIG. 9 is a diagram showing the schematic construction of a testing apparatus according to a third embodiment of the present invention.

FIG. 9 is a diagram showing the construction of a testing apparatus 60 according to a third embodiment of the present invention, wherein those parts corresponding to the parts described previously are designated by the same reference numerals and the description thereof will be omitted.

With the present embodiment, there is provided a supply current waveform correction circuit 28 between the power supply unit 22 and the semiconductor integrated circuit device 21A mounted on the test bed 21, and the supply voltage from the power supply unit 22 is supplied to the semiconductor integrated circuit device 21A via such a supply current waveform correction circuit 28. For the waveform monitor circuit 27, it is possible to use the voltage monitor circuit 30 in the previous embodiment.

Figure 10:
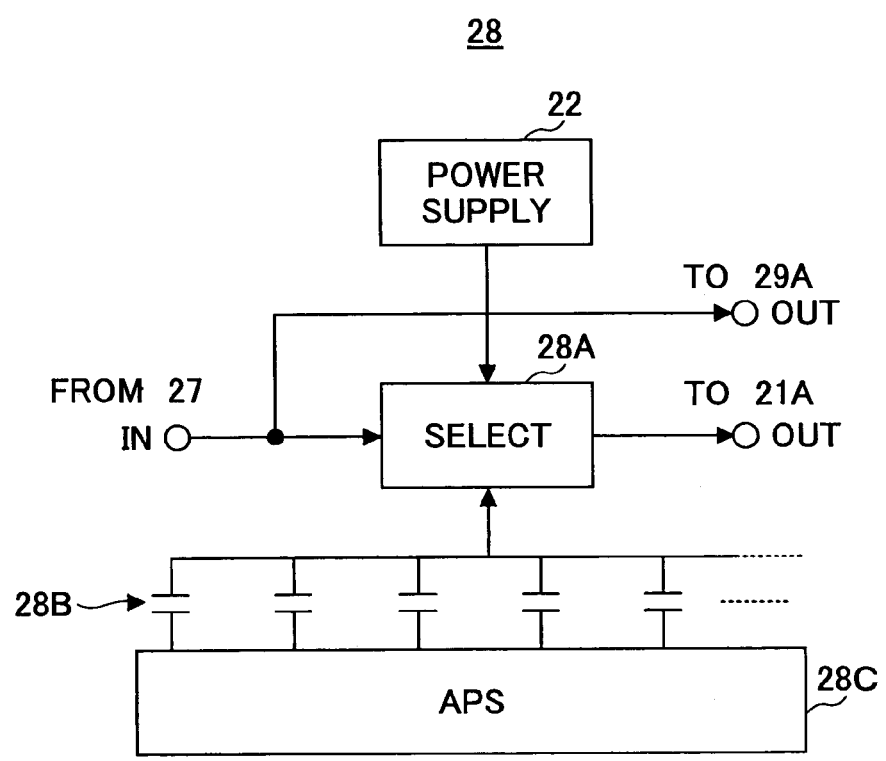
FIG. 10 is a block diagram showing a part of FIG. 9.

FIG. 10 shows the construction of the supply current waveform correction circuit 28 of FIG. 9.

Referring to FIG. 10, the supply current waveform correction circuit 28 includes a capacitor array 22B connected to the power supply unit 22 via a selection circuit 22A, wherein each of the capacitor elements constituting the capacitor array 22B is connected commonly to an APS (additional power supply) 28C.

The selection circuit 22A is supplied with the output signal of the waveform monitor circuit 27 and connects one or more of the capacitor elements in the capacitor array 22B to the power supply unit 22 selectively. Because each of the capacitor elements is charged by the APS 28C, the waveform correction circuit 28 compensates for the power supply unit and increases the effective power supply capacity adaptively.

Figure 11:
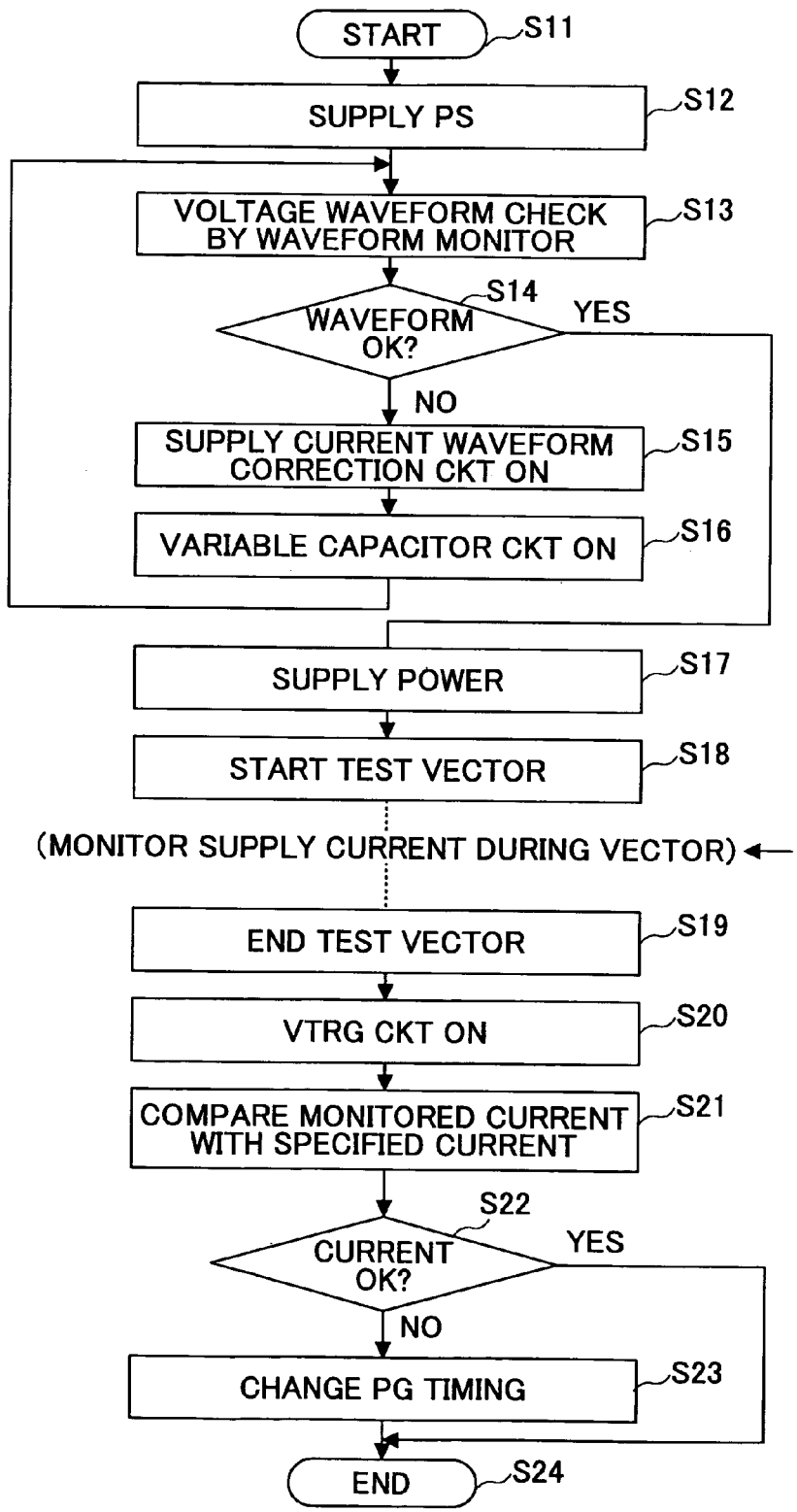
FIG. 11 is a flowchart explaining the operation of the testing apparatus of FIG. 9.

FIG. 11 is a diagram showing the outline of the functional test of the semiconductor integrated circuit device 21A conducted by using the testing apparatus 60 and including the operation of the supply current correction circuit 28.

Referring to FIG. 11, the test is started with a step 11 and the power supply unit 22 is activated in a step 12. Further, the supply current waveform is checked in a step 13 by the waveform monitor circuit 27.

Next, in a step 14, judgment is made as to whether or not the supply current waveform if normal. When it is judged that the supply current waveform includes a spike, the supply current waveform correction circuit 28 is activated and the selection circuit 22A connects a predetermined number of the capacitor elements in the capacitor array 22B to the selection circuit 22A. Thereby, the number of the capacitors to be connected is determined based on the magnitude of the detected spike.

After the step 16, the process returns to the step 13 and judgment of the supply current waveform is conducted again in the step 14.

When it is judged in the step 14 that the acquired voltage waveform of the supply current is free from a spike, the process proceeds to a step 17 and the functional test is started by feeding the supply voltage to the semiconductor integrated circuit device 17.

Thus, in a step 18, supply of the test pattern (test vector) to the semiconductor integrated circuit device 21A is started and the desired functional test is continued until it is finished with a step 19.

With the present embodiment, it should be noted that the routine of step 13-step 16 is repeated during the steps 18-19, and dropping of the supply voltage is compensated for whenever there is caused a drop of the supply voltage during the functional test, by adaptively connecting additional capacitor elements to the power supply unit 22.

With this, dropping of the supply voltage is compensated for without the power supply unit 22 causing increase of the supply current, and the fluctuation of the load of the power supply unit 22 is maintained minimum.

When the functional test is over with the step 19, the post processing sequence is started, and the VTRG 29A is activated in a step 20. Thereby, the process of the steps 21-23 is repeated and the period of the system clock is increased gradually.

Thus, with the present embodiment, the supply current value (i) detected by the waveform monitor circuit 27 is compared with a predetermined current value (spec i) in a step 21 and judgment is made in a step 22 as to whether or not the detected current value (i) exceeds the foregoing predetermined current value (spec i).

When the result of the judgment of the step 22 is YES, the process proceeds to a step 23, and the clock period T of the rate generator 25B is increased according to the equation $T=T_0 \times (i/\text{spec } i)$, and thus by the factor of (i/spec i). Here, it should be noted that $T_0$ is the current clock period.

As a result, the system clock speed is decreased gradually similarly to the case of FIG. 4, and the problem of overshooting of the supply voltage is avoided effectively.

It should be note that such an approach of changing the clock period or speed by monitoring the current value is applicable also to each of the previous embodiments.

Further, when it is judged with the present embodiment that the supply voltage supplied to the semiconductor integrated circuit device has exceeded a predetermined level, it is also possible to connect a capacitor element similar to that of FIG. 10 (not shown) to the power supply unit 22 via the selection circuit 28A such that the overshoot is absorbed by the capacitor element.

Further, while the present invention has been explained heretofore with regard to preferable embodiments, the present invention is by no means limited to such specific embodiments and various variations and modifications may be made without departing from the scope of the invention.

What is claimed is:

1. A testing method of a semiconductor integrated circuit device, comprising;
    a testing step of conducting a functional test by supplying test pattern data to a semiconductor integrated circuit device mounted upon a testing apparatus; and
    a post processing step conducted after said testing step for continuously driving said semiconductor integrated circuit device after said testing step by supplying dummy test pattern to said semiconductor integrated circuit device,
    wherein said test pattern data is supplied with a first system clock speed while said dummy test pattern data is supplied with a second, slower system clock speed,
    said post processing step switching a system clock speed of said testing apparatus from said first system clock speed to said second system clock speed at the same time as finishing of said testing step.

2. The method as claimed in claim 1, wherein said second clock speed is decreased gradually in said post processing step.

3. The method as claimed in claim 2, wherein said post processing step decreases said clock speed by 50% per each clock pulse.

4. The testing method as claimed in claim 1, wherein said post processing step monitors a supply voltage supplied to said semiconductor integrated circuit device mounted upon said testing apparatus and determines said second system clock speed such that a voltage overshoot caused in said supply voltage does not exceed a predetermined level.

5. The testing method as claimed in claim 1, wherein said post processing step comprises the steps of: monitoring a supply voltage supplied to said semiconductor integrated circuit device mounted upon said testing apparatus; and connecting a capacitor element to a power supply unit provided in said testing apparatus, when said supply voltage has exceeded a predetermined level, for providing a supply voltage to said semiconductor integrated circuit device.

6. The method as claimed in claim 1, wherein said testing step comprises the steps of: monitoring a supply voltage provided to said semiconductor integrated circuit device mounted upon said testing apparatus; and connecting a charged capacitor element to a power supply unit providing said supply voltage to said semiconductor integrated circuit device mounted upon said testing apparatus when said supply voltage has decreased below a predetermined level.

7. A testing apparatus of semiconductor integrated circuit device, comprising:
    a test bed mounted with a semiconductor device to be tested;
    a power supply unit supplying a drive current to said semiconductor integrated circuit device mounted upon said test bed;
    a pattern generator supplying test pattern data to said semiconductor integrated circuit device mounted upon said test bed; and
    a verification circuit verifying a response of said semiconductor integrated circuit device caused in response to supply of said test pattern data,
    wherein said testing apparatus further comprises a controller for controlling a system clock speed thereof,
    said pattern generator supplying said test pattern data to said semiconductor integrated circuit device at the time of functional test of said semiconductor integrated circuit device, with a first system clock speed,
    said pattern generator supplying dummy test pattern to said semiconductor integrated circuit device at the time of post processing conducted after said functional test with a second, slower system clock speed, said controller changing a system clock speed of said testing apparatus from said first system clock speed to said second system clock speed at the same time to completion of said functional test.

8. The testing apparatus as claimed in claim 7, wherein said control unit decreases said second system clock speed gradually during said post processing.

9. The testing apparatus as claimed in claim 7, wherein said controller decreasing said second system clock speed by 50% per each clock pulse during said post processing.

10. The testing apparatus as claimed in claim 7, wherein said testing apparatus comprises a voltage monitor circuit monitoring a supply voltage provided to said semiconductor integrated circuit device mounted upon said monitoring apparatus, said controller determining said second clock speed such that a voltage surge caused in said supply voltage does not exceed a predetermined level.

11. The testing apparatus as claimed in claim 7, wherein said testing apparatus further comprises: a voltage monitoring circuit monitoring a supply voltage provided to said semiconductor integrated circuit device mounted upon said testing apparatus; and a capacitor element provided in a manner connectable to said power supply unit in parallel, said controller connecting said capacitor element to said power supply unit when said supply voltage has exceeded a predetermined level during said post processing.

12. The testing apparatus as claimed in claim 7, wherein said testing apparatus further comprises: a voltage monitoring circuit monitoring a supply voltage provided to said semiconductor integrated circuit device mounted upon said testing apparatus; and a capacitor element provided in a manner connectable to said power supply unit in parallel, said capacitor element being connected to a charging circuit, said controller connecting said capacitor element to said power supply unit when said supply voltage has exceeded a predetermined level during said post processing.

* * * * *